United States Patent [19]

Suzuki

[11] 4,099,238

[45] Jul. 4, 1978

[54] APPARATUS FOR DETERMINING A MAGNETIC FIELD

[75] Inventor: Tomoaki Suzuki, Funabashi, Japan

[73] Assignee: Ricoh Company, Ltd., Japan

[21] Appl. No.: 674,088

[22] Filed: Apr. 6, 1976

[30] Foreign Application Priority Data

Apr. 7, 1975 [JP] Japan ................................ 50-42515

[51] Int. Cl.² ........................................... G01R 33/06
[52] U.S. Cl. ............................. 364/481; 73/DIG. 3; 324/251; 330/6; 364/847
[58] Field of Search ................... 235/151.31, 194, 197; 360/111, 112, 115; 340/174 HA; 324/117 R, 43 R, 45; 330/6; 364/481, 847; 73/DIG. 3

[56] References Cited

U.S. PATENT DOCUMENTS

| | | | |
|---|---|---|---|
| 2,964,738 | 12/1960 | Barney et al. | 235/194 |
| 3,121,788 | 2/1964 | Hilbinger | 235/194 |
| 3,320,520 | 5/1967 | Pear, Jr. | 324/45 |
| 3,365,665 | 1/1968 | Hood | 324/45 |
| 3,597,679 | 8/1971 | Habfast | 324/45 |
| 3,835,373 | 9/1974 | Matula | 324/45 |

OTHER PUBLICATIONS

Barlow, H. N.; Experimental Applications of Hall-Effect Wattmeters at 50Hz; IEEE Transactions on Instrumentation and Measurement; vol. 1M-14 No. 4; Dec. 1965, pp. 238-247.

Fuchs et al.; A Hall Effect Analogue Multiplier; Electronic Engineering; vol. 32, No. 392, Nov. 1960, pp. 696-699.

Motto, J. W. Jr.; Using the Hall Generator, a New Control and Instrumentation Component–Part I; Automatic Control, vol. 14, No. 6, Jun. 1961; pp. 48-53.

Kataoka, S; Multiplying Action of Magnetoresistance Effect in Semiconductors and its Application to Power Measurements; Proc. IEEE, vol. 111, No. 11, Nov. 1964.

*Primary Examiner*—Malcolm A. Morrison
*Assistant Examiner*—Errol A. Krass
*Attorney, Agent, or Firm*—McGlew and Tuttle

[57] ABSTRACT

A magnetic field is determined with a Hall element having a high sensitivity. Such an element is very susceptible to a variation of environmental temperature and thus requires a compensation thereof for the determination of a magnetic field. Two electric signals, indicative of the magnitudes of the Hall voltage and the temperature, respectively, are produced and fed into respective inputs of an analog calculator to thereby indicate the determined magnitude of the magnetic field automatically. In one aspect of the invention, the temperature signal may be obtained by detecting a control voltage across the control current terminals of the Hall element during passage of the control current therethrough. Alternatively, it may be obtained by means of a thermistor.

7 Claims, 8 Drawing Figures

| TEMPERATURE A (°C) | MAGNETIC DENSITY B (GAUSS) |
|---|---|
| 8 | 99 |
| 10 | 100 |
| 15 | 101 |
| 20 | 102 |
| 25 | 102 |
| 30 | 102 |
| 34 | 101.8 |
| 41 | 100 |

APPARATUS FOR DETERMINING A MAGNETIC FIELD

BACKGROUND OF THE INVENTION

The invention relates to the determination of a magnetic field using a Hall element.

As is well recognized, and as illustrated in FIG. 1, the determination of a magnetic field with a Hall element comprises the steps of passing a control current $I_C$ between a pair of input terminals or control current terminals of a Hall element 1 which is located within a magnetic field to be determined, detecting the Hall effect which results from the flux density B of the magnetic field as a Hall voltage is developed across a pair of output terminals which are disposed at right angles to the control current terminals, and determining the flux density B from the detected Hall voltage $V_H$ on the basis of a predetermined relationship between the flux density and the Hall voltage.

A Hall element has a high sensitivity and is capable of detecting a very weak magnetic field. In particular, a Hall element comprising an evaporated indium antimonide has an exceedingly high sensitivity. A Hall voltage $V_H$ of a Hall element 1 can be defined by the following expression:

$$V_H = K(T)I_C B \quad (1)$$

wherein $K(T)$ represents a coefficient, referred to hereafter as a temperature coefficient, which depends on the configuration of the element, temperature and the like, $I_C$ represents the control current and $B$ the flux density which passes through the Hall element in a direction perpendicular thereto. Although a Hall element has a high sensitivity, it suffers from a strong dependency of its output on the temperature. The temperature coefficient $K(T)$ appearing in the equation (1) varies with a change in the temperature, and the variation is particularly noticeable with the Hall element comprising evaporated indium antimonide. An exemplary variation of the temperature coefficient with temperature is graphically illustrated in FIG. 2. As a consequence, in the determination of a magnetic field with a Hall element, a variation in the magnitude of the temperature coefficient $K(T)$ must be compensated by applying a correction or conversion to the Hall voltage $V_H$ obtained, or by maintaining the environmental temperature constant, to prevent a variation in the temperature coefficient.

SUMMARY OF THE INVENTION

It is an object of the invention to provide apparatus for determining a magnetic field with a Hall element which is based on the novel approach that the Hall voltage $V_H$ is treated as a function of two variables, namely, the flux density B and the temperature T which are used as inputs.

DETAILED DESCRIPTION OF THE PREFERRED EMBODIMENTS OF THE INVENTION

As will be evident from the equation (1), when the control current $I_C$ is maintained constant, the Hall voltage $V_H$ produced by a Hall element 1 is considered as a fuction of two variables, namely, the flux density B and the temperature T. Thus, it may be expressed as follows:

$$V_H = g(B, T) \quad (2)$$

Figure 1:
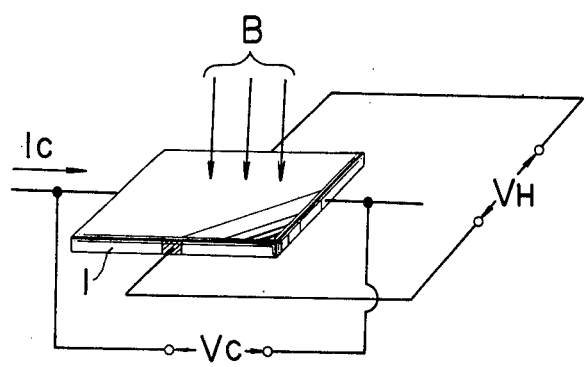
FIG. 1 is a schematic view, illustrating the determination of a magnetic field with a Hall element.
Figure 2:
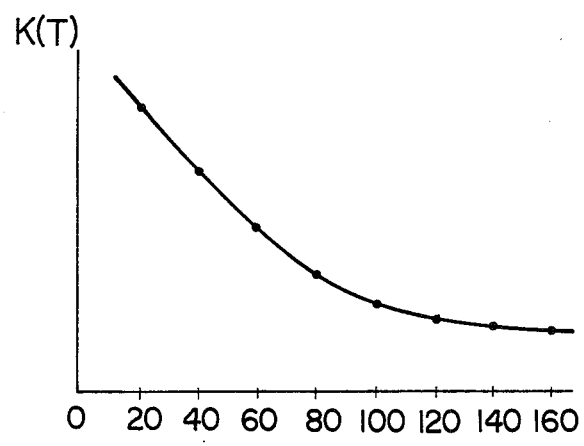
FIG. 2 graphically shows an exemplary change in the magnitude of the temperature coefficient of a Hall element comprising evaporated indium antimonide.

The function g can be approximated by utilizing the equation (1) and the profile of the temperature coefficient function K(T) shown in FIG. 2. By way of example, the temperature coefficient K(T) shown in FIG. 2 may be approximated as follows:

$$K(T) = a_0 - a_1 T + a_2 T^{-1} + a_3 T^{-2} \quad (3)$$

The coefficients $a_0$, $a_1$, $a_2$ and $a_3$ are determined so that the equation (3) provides a best approximation of the curve shown in FIG. 2. The accuracy of the approximation can be improved by adding further terms of T having a higher power. In the example given above, the function g can then be approximated as follows:

$$V_H = (a_0 - a_1 T + a_2 T^{-1} + a_3 T^{-2}) BIc, \quad (4)$$

where the control current $I_C$ is constant. Thus it will be seen that the determination of the magnetic field with the Hall element 1 requires measuring the temperature T and the Hall voltage $V_H$ and determining the value of B from the following equation:

$$B = V_H/(a_0 - a_1 T + a_2 T^{-1} + a_3 T^2) Ic \quad (5)$$

A value of the flux density B which is calculated in this manner provides a good approximation for the value of the flux density of the magnetic field to be determined over a temperature range in which the approximation (3) is applicable, and is found to be usable for practical purposes. For a reduced temperature range, the accuracy of approximation by the equation (3) can be further improved. Alternatively, for a small range of temperature variation, a segment of the curve shown in FIG. 2 which lies within the range can be approximated by a rectilinear line. Stated differently, a particular form of the function g can be selected so as to provide an optimum approximation, depending on the circumstances and purpose of the determination.

By way of example, when it is known that a change in the magnetic field to be determined with the Hall element 1 remains relatively small and the range of temperature variation is also small, the equation (2) can be expanded into a Taylor's series about fixed values $B_0$, $T_0$ and neglecting further terms beyond the first power. Thus, $$V_H = g(B_0, T_0) + \delta/\delta T\, g(B_0, T_0)(T - T_0) + \delta/\delta B\, g(B_0, T_0)(B - B_0) \quad (6)$$

In this equation, $\delta/\delta T\, g(B_0, T_0)$ or like term represents a partial differentiation by temperature $T$ of the function $g$ at $B = B_0$ and $T = T_0$. Optimum values are selected for $B_0$ and $T_0$ depending on the circumstances of determination. For example, when it is desired to determine a magnetic field having a flux density in a range from 50 to 150 Gauss at room temperature, $T_0$ may be chosen to be equal to 20° C as an approximate mean value of the room temperature throughout the year and $B_0$ may be chosen to be equal to 100 Gauss which is a mean value of the described range. In this instance, a control current $I_C$ on the order of 5 mA is suitable. The next step then is to place the Hall element 1 in the magnetic field which is known to have a flux density B of 100 Gauss at a temperature T of 20° C, and to determine the Hall voltage $V_H$ when a control current $I_C$ of 5 mA is passed therethrough. This provides the value of the constant $g(B_0, T_0)$. then the temperature is maintained at 20° C while the magnetic field is varied to produce a functional relationship between the Hall voltage $V_H$ and the flux density B, which relationship is differentiated at $B = 100$ Gauss, thus obtaining another constant $\delta/\delta B\, g(B_0 = 100$ Gauss, $T_0 = 20°$ C). In a similar manner, a further constant $\delta/\delta T\, g(B_0 = 100$ Gauss, $T_0 = 20°$ C) can be obtained. By rewriting the constant $g(B_0 = 100$ Gauss, $T_0 = 20°$ C) as $V_{HO}$, the constant $\delta/\delta T\, g(B_0 = 100$ Gauss, $T_0 = 20°$ C) as $b_1$ and the constant $\delta/\delta B\, g(B_0 = 100$ Gauss, $T_0 = 20°$ C) as $b_2$, $V_H$ is expressed as follows:

$$V_H = V_{HO} + b_1(T - 20) + b_2(B - 100) \quad (7)$$

Solving this equation for B, there results:

$$B = C_1 V_H + C_2 T + C_3 \quad (8)$$

wherein $$C_1 = 1/b_2,\ C_2 = -b_1/b_2,\ \text{and}\ C_3 = 100 + 20b_2/b_1 - V_{HO}/b_2 \quad (9)$$

Thus, when $V_H$ and $T$ are known, their substitution into the equation (8) provides a good approximation for the flux density in a range from 50 to 150 Gauss and at room temperature.

Since the Hall voltage $V_H$ is an electrical output of the Hall element and the temperature T can be converted into an electrical signal by way of a thermistor, for example, an analog circuit may be formed which effects the calculation according to the equation (5) or (8), and the Hall voltage $V_H$ and the temperature T obtained may be directly inputted into the analog circuit to provide a value of the flux density B in accordance with the equation (5) or (8). This represents the principle on which the invention is based. However, the measurement of the temperature by way of a thermistor is not preferred because of the increased cost and the liability to produce an error in the measurement which results from the influence of a magnetic field, produced by a current flow through the thermistor, upon the magnetic field to be determined, in particular when the latter field is very weak.

Figure 3:
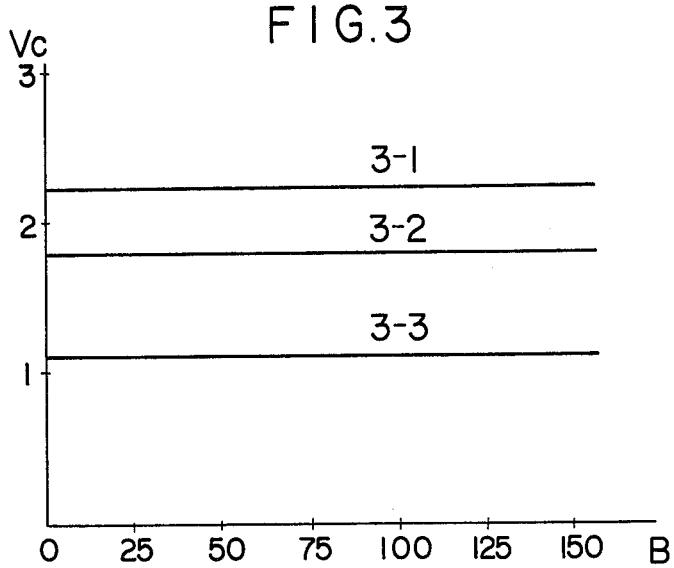
FIG. 3 graphically shows the relationship between the flux density B and the voltage $V_C$ across the control current terminals of the Hall element, with the temperature being taken as a parameter.
Figure 4:
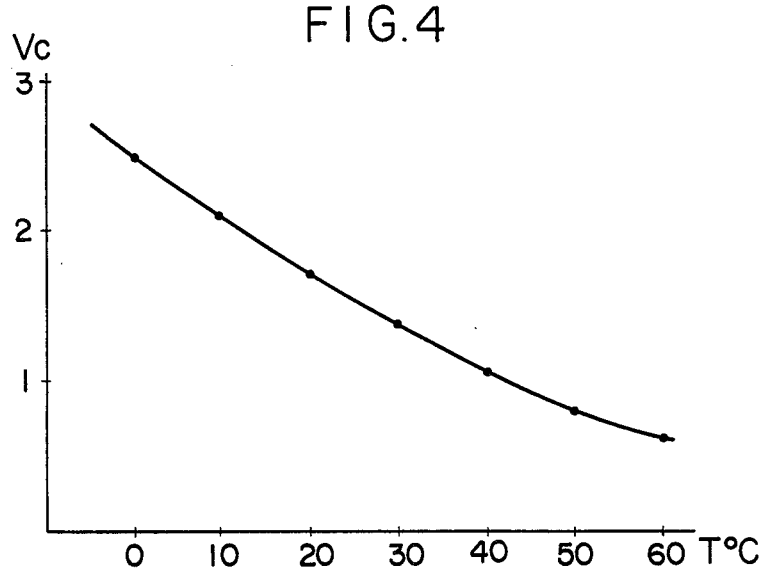
FIG. 4 graphically shows the relationship between the temperature and the voltage $V_C$ across the control current terminals of the Hall element.

In accordance with the invention, it is found that there exists a simple characteristic relationship between the voltage $V_C$ across the control current terminals of the Hall element and the temperature T. Specifically, FIG. 3 shows this relationship, with the temperature T being chosen as a parameter. The abscissa of FIG. 3 represents the flux density in units of Gauss while the ordinate represents the voltage $V_C$ in units of voltage. Curves 3-1, 3-2 and 3-3 correspond to temperatures of 6° C, 19.4° C and 40.7° C, respectively. As will be evident from the graphic illustration, the voltage $V_C$ across the control current terminals does not change with a change in the magnetic field when the temperature is maintained constant, and there is a one-to-one correspondence between the voltage $V_C$ and the temperature T. As a result, the temperature T can be eliminated from the variables which are used in the function $g$, by substituting the voltage $V_C$ for it, and it is possible to define the flux density B in terms of the Hall voltage $V_H$ and the voltage $V_C$ across the control current terminals. FIG. 4 graphically shows a curve representing the relationship between the voltage $V_C$ and the temperature T which has been obtained experimentally and which has been found to be substantially not influenced by a change in the magnitude of the magnetic field in a range from 0 to 200 Gauss, as expected. In view of the foregoing, a procedure for determining a magnetic field at room temperature on the basis of the curve shown in FIG. 4 can be established by utilizing the approximation (6) for a range of flux density from 50 to 150 Gauss. The range of temperature change is chosen between 10° and 40° C, and the curve of FIG. 4 is approximated within this range by the following linear function:

$$V_C - V_{CO} = d(T - T_0) \quad (10)$$

Since the average room temperature is approximately 20° C, $T_0$ is chosen equal to 20° C, and the inclination of the line repreented by the expression (10) is determined by its value at $T_0 = 20°$ C. Specifically, $d$ has a value of $-0.034$. The value of $V_{CO}$, that is, the voltage $V_C$ at $T = 20°$ C, is 1.75V. Using these values and solving the equation (10) for T, there results:

$$T - 20 = 1/d\, (V_C - 1.75) \quad (11)$$

Figure 5:
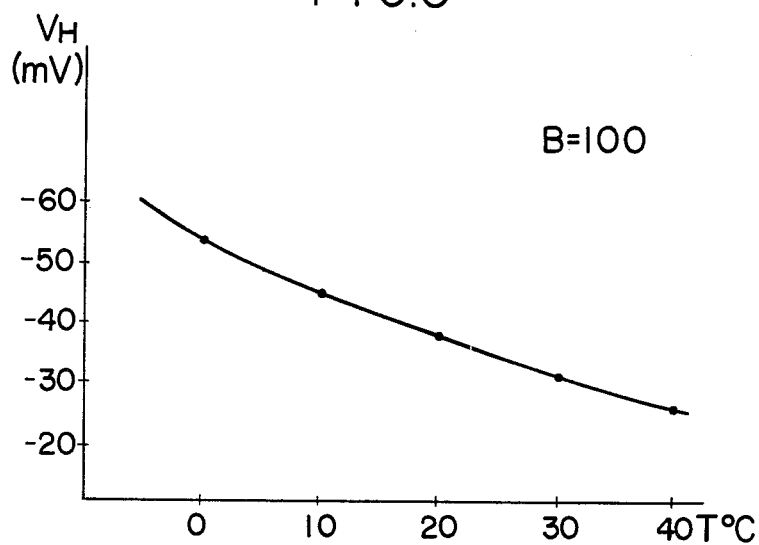
FIG. 5 graphically shows the relationship between the Hall voltage $V_H$ and the temperature T when a flux density of 100 Gauss is applied to the Hall element.

The relationship between the Hall voltage $V_H$ and the temperature T at a median value of the flux density B, namely 100 Gauss, is found to be represented by a curve shown in FIG. 5. Also, the relationship between the Hall voltage $V_H$ an the flux density B at a temperature of 20° C is found to be represented by a curve shown in FIG. 6. In these instances, the control current $I_C$ has been maintained at a value of 5mA.

Figure 6:
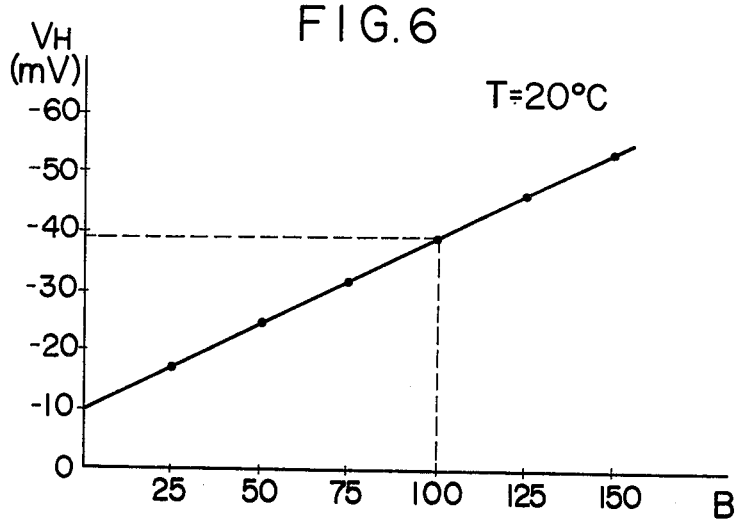
FIG. 6 graphically shows the relationship between the Hall voltage $V_H$ and the flux density B at a temperature of 20° C.

The inclination of the curve sown in FIG. 5 at a temperature of 20° C is found to be $+0.60$ while the inclination of the curve shown in FIG. 6 at a flux density of 100 Gauss is found to be $-0.287$. Thus $$\delta/\delta T\, g\, (B_0 = 100\ \text{Gauss},\ T_0 = 20°\ \text{C}) = +0.6$$

$$\delta/\delta B\, g\, (B_0 = 100\ \text{Gauss},\ T_0 = 20°\ \text{C}) = -0.287$$

The Hall voltage $V_H$ at this point is determined to be 37mV. Substituting these specific values into the equation (6) and replacing the term $(T - T_0)$ appearing in the equation (6) by the equation (11), the following expression is obtained:

$$V_H = -37 + (+0.6)\{1/0.034\ (V_C - 1.75)\} - 0.287 \\ (B - 100) \qquad (12)$$

Solving this equation for B, we have $$B = 3.50\ V_H - 61.3\ V_C + 78 \qquad (13)$$

Figures 7, 8:
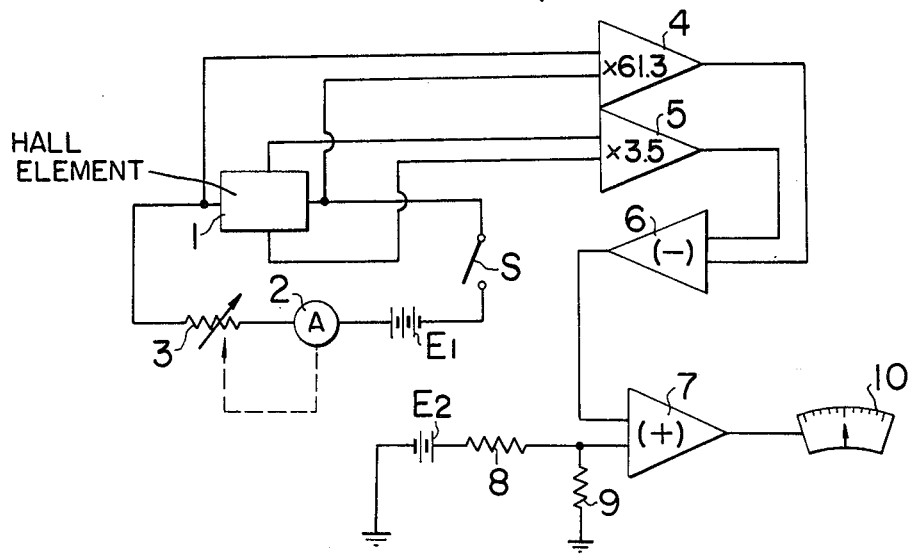
FIG. 7 is a schematic diagram of one apparatus for carrying out the invention.
FIG. 8 is a chart illustrating the accuracy of determination which can be achieved with the apparatus shown in FIG. 7.

FIG. 7 is a schematic diagram of an apparatus which is used to carry out the invention. Specifically, the apparatus essentially comprises a Hall element 1, d.c. sources $E_1$, $E_2$, ammeter 2, variable resistor 3, differential amplifiers 4 and 5, subtraction amplifier 6, addition amplifier 7, resistors 8 and 9, and display 10. A d.c. voltage is applied from the source $E_1$ across the control current terminals of the Hall element 1, and when a switch S is closed, a control current $I_C$ flows therethrough. The ammeter 2 and the variable resistor 3 are connected in series in the control current circuit, and the variable resistor 3 is controlled by the ammeter 2 in a manner such that a constant current flow is assured. For example, when a control current of 5mA is chosen, the resistance of the variable resistor 3 is controlled as the internal resistance of the Hall element 1 varies so as to maintain a control current of 5mA through the element 1. The pair of terminals which provide a Hall voltage are connected to the input terminals of the differential amplifier 5 while the control current terminals of the element are connected with the input terminals of the differential amplifier 4.

The outputs of both differential amplifiers 4 and 5 are supplied to respective inputs of the subtraction amplifier 6, the output of which is connected with one input of the addition amplifier 7. The amplifier 7 has its another input connected to be supplied with a d.c. voltage from the source $E_2$, which is adjusted to a constant value by means of resistors 8 and 9. The differential amplifiers 4 and 5, subtraction amplifier 6, addition amplifier 7, resistors 8 and 9 and d.c. source $E_2$ constitute together an analog circuit which effects the calculation in accordance with the equation (13).

When the Hall element 1 is placed in a magnetif field to be determined and the switch S turned on, the Hall voltage $V_H$ developed and the voltage $V_C$ across the control current terminals which depend on the flux density and the temperature are supplied as electrical signals to the differential amplifiers 5 and 4, respectively. The Hall voltage $V_H$ is multiplied by a factor 3.5 in the amplifier 5 while the voltage $V_C$ is multiplied by a factor of 61.3 in the amplifier 4. The subtraction amplifier 6 produces an output which is equal to 3.5 $V_H$ − 61.3 $V_C$. The resistance of the resistors 8 and 9 is adjusted so that the d.c. voltage supplied from the source $E_2$ to the addition amplifier 7 becomes equal to 78 volts. Thus, the addition amplifier 7 produces an output which corresponds to the sum on the right-hand side of the equation (13), namely, the flux density of the magnetic field to be determined. When the apparatus is used to determine a magnetic field which has been controlled to produce a flux density of 100 Gauss and when the temperature is changed within the range described above, there is obtained an experimental result which is shown in the chart of FIG. 8. This clearly indicates that the apparatus provides a practically satisfactory accuracy of measurement. The accuracy can be improved by increasing the accuracy of the function g defined by the equation (2) or the accuracy of approximation by the equation (10), even though this may involve a complication of the analog circuit involved. However, it should be obvious that the described procedure can be generalized for any intended range of temperature variation and flux density.

It is to be noted that, when the flux density substantially increases, the voltage $V_C$ across the control current terminals of the Hall element depends not only on the temperature T, but also on the flux density B, or more exactly, to the square thereof, and is therefore expressed as follows:

$$V_C = V_0 + V_1(T) + V_2(B^2) \qquad (14)$$

Under such a situation, resort may be had to the equation (7) while utilizing a thermistor to produce an electrical signal indicative of temperature T, since, except for the cost requirement, the magnetic influence of the thermistor is negligible for an increased flux density. Alternatively, where the temperature can be assumed to be uniform throughout the space concerned with the measurement, another Hall element may be located therein at a position where it is free from the influence of the magnetic field to be determined, and the voltage $V_{C1}$ across the control current terminals of this Hall element may be used as the voltage $V_C$. It will be also apparent that the equation (14) may be approximated by a suitable function, and the approximation for B can be determined according to such function.

What is claimed is:

1. Apparatus for determining the flux density of a magnetic field by using a Hall element comprising, in combination, a Hall element, having a pair of control current input terminals and a pair of Hall voltage output terminals, positioned in the magnetic field; a first potential source connected across said input terminals and operable to supply a constant magnitude control current therebetween; an analog calculation circuit having inputs and an output; means connecting said Hall voltage output terminals directly to one input of said calculation circuit to supply, to said one input, an electrical control signal corresponding to the Hall output voltage; and means supplying the voltage across said control input terminals, as an electrical signal corresponding to the temperature at the position of said Hall element, directly to another input of said calculation circuit; said analog calculation circuit deriving, at its output, an electrical signal corresponding to the flux density of the magnetic field.

2. Apparatus as claimed in claim 1, including means supplying a constant voltage directly to a third input of said calculation circuit.

3. Apparatus as claimed in claim 1, wherein said Hall element has a characteristic expressed by the equation $V_H = g(B,T)$ wherein $V_H$, B and T represent, respectively, the Hall output voltage, the flux density of the magnetic field, and the temperature at the position where said Hall element is located; said analog calculation circuit effecting a calculation in accordance with an approximation obtained by solving said equation $V_H = G(B,T)$ for B; said approximation being an expansion of said equation into a Taylor's series about fixed values $B_0$ and $T_0$ of B and T, respectively, with further terms beyond the first power neglected.

4. Apparatus as claimed in claim 3, in which the values of $B_0$ and $T_0$ are, respectively, 100 Gauss and 20° C.

5. Apparatus as claimed in claim 3, in which said analog calculation circuit comprises a first differential amplifier whose input is said one input of said calculation circuit; a second differential amplifier whose input is said another input of said calculation circuit; and a subtraction amplifier having inputs connected to the outputs of said differential amplifier.

6. Apparatus as claimed in claim 5, in which said analog calculation circuit includes an addition amplifier having two inputs; said subtraction amplifier having an output connected to one input of said addition amplifier; and means supplying a constant voltage directly to the other input of said addition amplifier; said addition amplifier having an output constituting the output of said analog calculation circuit.

7. Apparatus as claimed in claim 1, in which said Hall element is comprised of evaporated indium antimonide.

* * * * *